(12) United States Patent
Suzuki et al.

(10) Patent No.: US 8,836,039 B2
(45) Date of Patent: Sep. 16, 2014

(54) SEMICONDUCTOR DEVICE INCLUDING HIGH-K/METAL GATE ELECTRODE

(75) Inventors: Jun Suzuki, Toyama (JP); Hiroshi Nakagawa, Toyama (JP)

(73) Assignee: Panasonic Corporation, Osaka (JP)

( * ) Notice: Subject to any disclaimer, the term of this patent is extended or adjusted under 35 U.S.C. 154(b) by 161 days.

(21) Appl. No.: 13/313,607

(22) Filed: Dec. 7, 2011

(65) Prior Publication Data

US 2012/0080756 A1    Apr. 5, 2012

Related U.S. Application Data

(63) Continuation of application No. PCT/JP2010/001001, filed on Feb. 17, 2010.

(30) Foreign Application Priority Data

Jul. 1, 2009    (JP) ................. 2009-156952

(51) Int. Cl.

| | | |
|---|---|---|
| *H01L 21/70* | (2006.01) | |
| *C23C 16/34* | (2006.01) | |
| *H01L 21/8238* | (2006.01) | |
| *H01L 21/28* | (2006.01) | |
| *C23C 16/455* | (2006.01) | |
| *H01L 29/51* | (2006.01) | |
| *H01L 29/49* | (2006.01) | |
| *H01L 29/78* | (2006.01) | |
| *H01L 29/66* | (2006.01) | |

(52) U.S. Cl.
CPC .......... *C23C 16/45531* (2013.01); *C23C 16/34* (2013.01); *H01L 21/823842* (2013.01); *H01L 21/28088* (2013.01); *H01L 29/518* (2013.01); *H01L 29/4966* (2013.01); *H01L 29/7833* (2013.01); *H01L 29/517* (2013.01); *H01L 29/6659* (2013.01); *H01L 21/823857* (2013.01)
USPC .................. 257/369; 257/410; 257/E29.255; 257/E27.062; 257/E21.19; 438/591

(58) Field of Classification Search
CPC ........ H01L 29/78; H01L 21/28; H01L 27/092
USPC ............ 257/69, 410, E29.255, E27.062, 369, 257/E29.19; 438/591
See application file for complete search history.

(56) References Cited

U.S. PATENT DOCUMENTS

| | | | |
|---|---|---|---|
| 6,271,573 B1 * | 8/2001 | Suguro | ......................... 257/407 |
| 6,399,484 B1 | 6/2002 | Yamasaki et al. | |

(Continued)

FOREIGN PATENT DOCUMENTS

| | | |
|---|---|---|
| JP | 07-078981 A | 3/1995 |
| JP | 2005-079512 | 3/2005 |

(Continued)

OTHER PUBLICATIONS

International Search Report issued in International Patent Application No. PCT/JP2010/001001, mailed May 25, 2010.

*Primary Examiner* — Caleb Henry
(74) *Attorney, Agent, or Firm* — McDermott Will & Emery LLP

(57) ABSTRACT

A semiconductor device includes a high dielectric gate insulating film formed on a substrate, and a metal gate electrode formed on the high dielectric gate insulating film. The metal gate electrode includes a crystalline portion and an amorphous portion. A halogen element is eccentrically located in the amorphous portion.

8 Claims, 11 Drawing Sheets

(56) References Cited

U.S. PATENT DOCUMENTS

| | | | |
|---|---|---|---|
| 6,531,394 B1 * | 3/2003 | Lee | 438/659 |
| 6,555,183 B2 * | 4/2003 | Wang et al. | 427/535 |
| 6,563,182 B2 * | 5/2003 | Horikawa | 257/405 |
| 7,944,005 B2 * | 5/2011 | Chun | 257/412 |
| 2001/0025972 A1 | 10/2001 | Moriwaki et al. | |
| 2001/0039107 A1 | 11/2001 | Suguro | |
| 2003/0013280 A1 * | 1/2003 | Yamanaka | 438/487 |
| 2003/0197232 A1 * | 10/2003 | Kamiyama | 257/412 |
| 2004/0029371 A1 * | 2/2004 | Hu | 438/582 |
| 2005/0048725 A1 | 3/2005 | Shibahara | |
| 2005/0110098 A1 * | 5/2005 | Yoshihara | 257/371 |
| 2005/0167767 A1 | 8/2005 | Akasaka | |
| 2006/0244080 A1 * | 11/2006 | Chen et al. | 257/408 |
| 2006/0244084 A1 * | 11/2006 | Lee et al. | 257/412 |
| 2006/0284249 A1 * | 12/2006 | Chen et al. | 257/344 |
| 2007/0052036 A1 | 3/2007 | Luan et al. | |
| 2007/0057335 A1 | 3/2007 | Tsuchiya et al. | |
| 2007/0272967 A1 | 11/2007 | Pantisano et al. | |
| 2007/0278558 A1 | 12/2007 | Koyama et al. | |
| 2008/0070370 A1 * | 3/2008 | Wu et al. | 438/301 |
| 2008/0224209 A1 * | 9/2008 | Chun | 257/334 |
| 2008/0280391 A1 * | 11/2008 | Shin et al. | 438/104 |
| 2009/0057678 A1 * | 3/2009 | Goldbach et al. | 257/66 |
| 2009/0114995 A1 | 5/2009 | Suzuki et al. | |
| 2010/0151681 A1 * | 6/2010 | Knapp et al. | 438/680 |
| 2010/0210086 A1 * | 8/2010 | Wang et al. | 438/306 |
| 2010/0216288 A1 * | 8/2010 | Chiu et al. | 438/231 |
| 2010/0219478 A1 | 9/2010 | Manabe et al. | |
| 2011/0031538 A1 * | 2/2011 | Hsieh et al. | 257/288 |

FOREIGN PATENT DOCUMENTS

| | | |
|---|---|---|
| JP | 2007-110091 | 4/2007 |
| JP | 2007-324545 | 12/2007 |
| JP | 2007-324593 | 12/2007 |
| JP | 2008-305950 | 12/2008 |
| JP | 2009-033032 | 2/2009 |

* cited by examiner

① ADSORPTION AND REACTION
② EXHAUSTION OF RESIDUAL GAS ($Cl_2$) WITH INERT GAS ($N_2$Ar)
③ SUPPLY OF $NH_3$

SEMICONDUCTOR DEVICE INCLUDING HIGH-K/METAL GATE ELECTRODE

CROSS-REFERENCE TO RELATED APPLICATION

This is a continuation of PCT International Application PCT/JP2010/001001 filed on Feb. 17, 2010, which claims priority to Japanese Patent Application No. 2009-156952 filed on Jul. 1, 2009. The disclosures of these applications including the specifications, the drawings, and the claims are hereby incorporated by reference in their entirety.

BACKGROUND

As the speed and degree of integration of semiconductor devices have been increased, the feature size of transistors has been reduced.

In a complementary metal oxide semiconductor (CMOS) device, which is a type of semiconductor devices, two types of transistors, i.e., an n-channel MOS (NMOS) transistor and a p-channel MOS (PMOS) transistor are used. In the NMOS transistor, on/off of current is controlled by transfer of electrons, and in the PMOS transistor, on/off of current is controlled by transfer of holes.

Conventionally, a gate insulating film used in a CMOS device is made of a silicon dioxide film, in general, and has a dielectric constant of about 3.9. However, when a gate insulating film has a reduced thickness since the size of transistors has been reduced, a leakage current is increased, and the power consumption and standby power consumption of the device are increased. Thus, the development of a high-k (high dielectric) gate insulating film has been conducted to allow reduction in equivalent oxide thickness (EOT) of the high-k gate insulating film even when an actual thickness of the high-k gate insulating film is larger than that of a silicon oxide film, using a gate insulating film having a dielectric constant of 4.0 or more.

However, if a conventional polysilicon gate electrode and a conventional high-k gate electrode are simply combined, a phenomenon called "depletion" of a gate electrode occurs. This is a phenomenon in which a depletion layer capacitance is generated between the high-k gate insulating film and the polysilicon gate electrode, thus eliminating the advantage that the EOT of the high dielectric gate insulating film is small. To reduce or prevent depletion of the gate electrode, it is necessary to combine a metal gate electrode, instead of the polysilicon gate electrode, with the high-k gate electrode. Furthermore, in forming a CMOS device, it is important to control a threshold voltage (Vt) at a proper level using the high-k gate insulating film/metal gate electrode.

When a conventional combination of a silicon oxide gate insulating film/a polysilicon gate electrode is used, an impurity such as boron and phosphorous, etc. is ion-implanted into polysilicon, and thermal treatment is performed to activate the impurity, thus improving the work function of polysilicon. For example, when polysilicon is not doped with an impurity, the work function of polysilicon is 4.65 eV, but the work function can be increased up to 5.15 eV by ion-implanting boron into polysilicon. By using this technique, threshold voltages Vt of a NMOS and a PMOS can be controlled.

However, when a high-k gate insulating film is used, due to traps contained in high density in the high-k gate insulating film, the Fermi level pinning which is a phenomenon in which the Fermi level is fixed occurs. Therefore, the work function cannot be changed at a doping level achieved by ion implantation, and threshold voltages cannot be controlled. Furthermore, in a metal-inserted-poly-Si stack (MIPS) structure including a combination of a metal gate electrode and a polysilicon gate electrode, it is difficult to adjust the work function by ion implantation, and the work function of a metal used for a gate electrode is dominant in Vt control.

In studies of the work function in such a combination of a high-k gate insulating film and a metal gate electrode, nitride of titanium, tungsten, tantalum, or molybdenum is used. As a metal gate electrode material, specifically, nitride of titanium and nitride of tungsten, each of which is nitride conventionally used as a DRAM material, are easy to handle in view of processing characteristics of dry etching and wet etching, etc.

SUMMARY

The work function of a titanium nitride (TiN) film greatly depends on its thickness. Therefore, the TiN film is formed to have a large thickness in a p-channel gate electrode which requires a high work function and to have a small thickness in an n-channel gate electrode which requires a low work function, thereby changing the work function of the TiN film.

However, the work function is saturated at a thickness of about 15 nm, and therefore, it is difficult to stably realize a high work function of 4.8 eV or more, which is required at a PMOS side.

When a high-k metal gate structure is employed, there is a concern that reduction in interface state between a high-k gate insulating film and a Si substrate which is possibly caused by defects in the high-k gate insulating film, or large internal stress of a TiN metal gate electrode film, might increase negative bias temperature instability (NBTI).

In view of the foregoing, a semiconductor device in which the work function is increased (to be, for example, 4.8 eV or more) at the PMOS side using a metal gate electrode made of TiN etc., and which includes a high-k gate insulating film having improved reliability such as reduced NBTI, etc. will be described below.

A semiconductor device according to the present disclosure includes a high dielectric gate insulating film formed on a substrate, and a metal gate electrode formed on the high dielectric gate insulating film, the metal gate electrode includes a crystalline portion and an amorphous portion, and a halogen element is eccentrically located in the amorphous portion.

In the semiconductor device, the halogen element is eccentrically located in the metal gate electrode, and thus, a large work function can be realized, as compared to a case where a halogen element is not contained. Also, the halogen element exists in the amorphous portion of the metal gate electrode. Thus, the metal gate electrode in which the halogen element is eccentrically located is realized.

Note that the halogen element is preferably at least one of chlorine or fluorine. Each of chlorine and fluorine has a higher electronegativity than that of nitrogen, and thus, the work function can be more reliably increased. Furthermore, when fluorine is used, NBTI can be improved.

The halogen element is preferably eccentrically located at $1 \times 10^{19}$ atoms/cm$^3$ or more. When the halogen element is eccentrically located at the above-described concentration, the work function can be more reliably improved.

The halogen element is preferably eccentrically located within a range of a thickness of 5 nm or less. When a thickness of a layer in which the halogen element is eccentrically located is increased in the metal gate electrode, a resistance value is increased. Therefore, it is preferable to avoid the increase in thickness of the layer, and specifically, the thickness of the layer in which the halogen element is eccentrically located is preferably 5 nm or less.

The high dielectric gate insulating film is preferably made of a hafnium silicate film or a hafnium oxide film.

The high dielectric gate insulating film preferably contains at least one of La, Mg, Al, or Ta. Thus, a threshold voltage can be controlled.

The metal gate electrode is preferably made of TiN.

A p-channel transistor including the high dielectric gate insulating film and the metal gate electrode is preferably formed. Thus, a high work function can be realized in the p-channel transistor.

Moreover, it is preferable that a p-channel transistor and an n-channel transistor each of which includes the high dielectric gate insulating film and the metal gate electrode are formed, the halogen element is eccentrically located at $1\times10^{19}$ atoms/cm$^3$ or more at a metal gate electrode side of an interface between the high dielectric gate insulating film and the metal gate electrode in the p-channel transistor, and a concentration of the halogen element is $1\times10^{18}$ atoms/cm$^3$ or less at a metal gate electrode side of an interface between the high dielectric gate insulating film and the metal gate electrode in the n-channel transistor.

Thus, in the p-channel transistor, the work function can be increased and, in the n-channel transistor, the work function can be reduced to be lower than the work function in the p-channel transistor.

Next, a method for fabricating a semiconductor device according to the present disclosure includes forming a high dielectric gate insulating film on a substrate, and forming a metal gate electrode on the high dielectric gate insulating film, and in the forming a metal gate electrode, a halogen element is eccentrically located at a metal gate electrode side of an interface between the high dielectric gate insulating film and the metal gate electrode.

According to the method for fabricating a semiconductor device according to the present disclosure, a semiconductor device in which a halogen element is eccentrically located, and thus, the work function is increased can be fabricated.

Note that it is preferable that the halogen element is chlorine, the metal gate electrode is made of TiN, and in the forming a metal gate electrode, the metal gate electrode is formed using atomic layer deposition in which a titanium source containing chlorine and a nitrogen source are alternately supplied.

When chlorine is used as a halogen element, the above-described configuration may be employed.

Moreover, it is preferable that the forming a metal gate electrode includes an early film formation process in which the metal gate electrode is deposited to a thickness of 5 nm, and a later process in which the metal gate electrode is deposited to a predetermined thickness after the early film formation process, in the early film formation process, an unsaturated reaction to increase residual chlorine in TiN, which is caused by supplying the nitrogen source for a time equal to or less than one tenth of a time which it takes for a reaction of the nitrogen source to be saturated, is repeated, and in the later process, a reaction caused by supplying the nitrogen source is repeated until the reaction of the nitrogen source is saturated.

Thus, chlorine can be eccentrically located within a range of a thickness of 5 nm or less at the metal gate electrode side of the interface between the high dielectric gate insulating film and the metal gate electrode.

Also, it is preferable that the halogen element is fluorine, the metal gate electrode is made of TiN, and in the forming a metal gate electrode, the metal gate electrode is formed using atomic layer deposition in which a titanium source containing chlorine and a nitrogen source are alternately supplied, and fluorine is eccentrically located at the metal gate electrode side of the interface by supplying a fluorine source.

When chlorine is used as a halogen element, the above-described configuration may be employed.

Moreover, it is preferable that the forming a metal gate electrode includes an early film formation process in which the metal gate electrode is deposited to a thickness of 5 nm, and a later process in which the metal gate electrode is deposited to a predetermined thickness after the early film formation process, in the early film formation process, exhausting, after supplying a titanium source containing chlorine, a residual gas using an inert gas, forming chlorine titanium fluoride by causing exposure with the fluorine source at a temperature of 400° C. or higher and 500° C. or lower at 1 Torr (133 Pa) or less for 0.5 seconds or less, and forming TiN containing residual fluorine by supplying the nitrogen source to nitrogenize the chlorine titanium fluoride are repeated, and in the later process, supply of the titanium source containing chlorine and supply of the nitrogen source are repeated.

Thus, chlorine can be eccentrically located within a range of a thickness of 5 nm or less at the metal gate electrode side of the interface between the high dielectric gate insulating film and the metal gate electrode.

The fluorine source is preferably at least one of NF$_3$ or F$_2$. Also, it is preferable that the titanium source containing chlorine is titanium tetrachloride, and the nitrogen source is ammonia.

It is preferable that a p-channel transistor and an n-channel transistor each of which includes the high dielectric gate insulating film and the metal gate electrode are formed, in the forming a metal gate electrode, the metal gate electrode in which a halogen element is eccentrically located is formed to a thickness of 10 nm or more and 20 nm or less, and the method further includes forming, after removing the metal gate electrode in which the halogen element is eccentrically located, another metal gate electrode which does not include a halogen element to a thickness of 5 nm or more an 10 nm or less in a region which is to be the n-channel transistor.

Thus, a semiconductor device in which, in the p-channel transistor, the work function can be increased and, in the n-channel transistor, the work function can be reduced to be lower than the work function in the p-channel transistor can be fabricated.

As described above, according to the present disclosure, a higher work function than the work function of the metal gate electrode which does not contain a halogen element can be achieved by causing a halogen element such as fluorine and chlorine etc. which has a high electronegativity to be eccentrically located at the interface between the high-k gate insulating film and the metal gate electrode of TiN etc. When fluorine is used, interface characteristics of the high-k gate insulating film can be improved, thus allowing increase in function and reliability of the p-channel transistor in the high-k gate insulating film/the metal gate electrode structure.

DETAILED DESCRIPTION

First Embodiment

Figure 1:
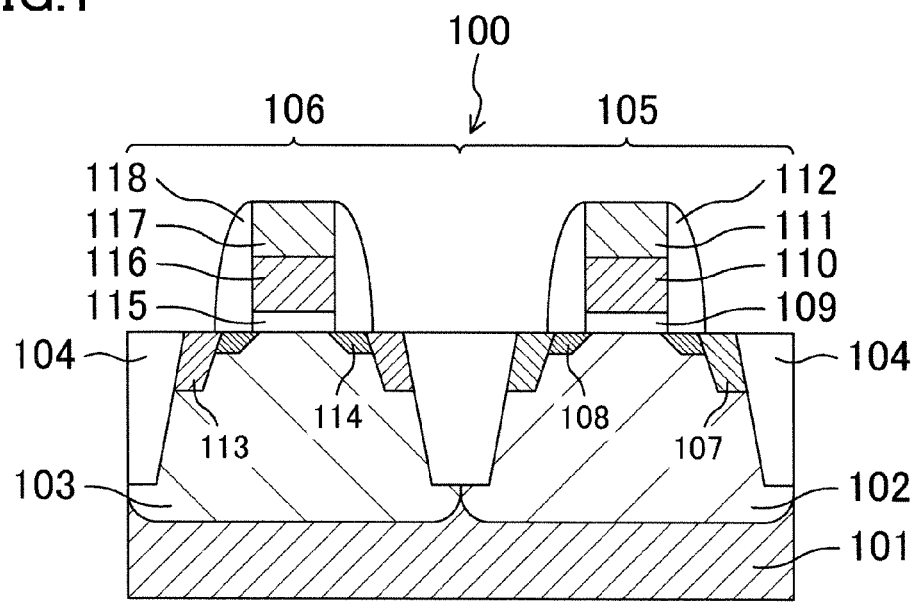
FIG. 1 is a cross-sectional view illustrating a schematic configuration of an example semiconductor device according to a first embodiment.

A semiconductor device, and an apparatus and a method for fabricating a semiconductor device according to a first embodiment will be described with reference to the accompanying drawings. FIG. 1 is a view schematically illustrating a cross section of a CMOS structure of an example semiconductor device 100 according to the first embodiment.

As shown in FIG. 1, the semiconductor device 100 is formed using a silicon substrate 101. A surface portion of the substrate 101 is divided by an isolation layer 104 made of a silicon oxide film in the form of shallow trench isolations (STIs), and an n-type well region 102 and a p-type well region 103 formed by ion implantation are provided in each divided area.

A p-channel transistor 105 is formed in the n-type well region 102. The p-channel transistor 105 includes a gate insulating film 109 which is a high-k (high dielectric) gate insulating film formed on the n-type well region 102, a TiN electrode 110 for a PMOS, formed thereon, a p-type diffusion layer 107 formed by ion implantation in portions of the n-type well region 102 located at both sides of the TiN electrode 110, and a p-type extension layer 108. Furthermore, a polysilicon electrode 111 which is ion-implanted with an impurity such as boron, etc. is formed on the TiN electrode 110, and sidewalls 112 made of a silicon oxide film or a silicon nitride film is formed to cover side walls of the TiN electrode 110 and the polysilicon electrode 111.

Upper portions of source/drain regions made of the p-type diffusion layer 107 and the p-type extension layer 108 and an upper portion of the polysilicon electrode 111 are silicided with nickel silicide (NiSi) or nickel platinum silicide (NiPtSi) (not shown). Furthermore, a SiGe epitaxial layer (not shown) containing 10%-30% germanium (Ge) may be formed in the p-type source/drain regions.

Similarly, an n-channel transistor 106 is formed in the p-type well region 103. The n-channel transistor 106 includes a gate insulating film 115 which is a high-k gate insulating film, a TiN electrode 116 for an NMOS, formed thereon, an n-type diffusion layer 113 formed in portions of a p-type well region 103 located at both sides of the TiN electrode 116, and an n-type extension layer 114. Furthermore, a polysilicon electrode 117 which is ion-implanted with an impurity such as boron, etc. is formed on the TiN electrode 116, and sidewalls 118 are formed to cover side walls of the TiN electrode 116 and the polysilicon electrode 117.

Upper portions of source/drain regions made of the n-type diffusion layer 113 and the n-type extension layer 114 and an upper portion of the polysilicon electrode 117 are silicided with nickel silicide (NiSi) or nickel platinum silicide (NiPtSi) (not shown). Furthermore, a carbon-doped Si epitaxial layer (not shown) containing 1%-3% carbon may be formed in the n-type source/drain regions.

Note that the gate insulating film 109 in the p-channel transistor 105 is formed so that a high-k film made of an oxide film containing Hf, Si, and Zr contains Al and Ta, etc. for controlling a work function thereof. Also, the gate insulating film 115 in the n-channel transistor is formed so that a high-k film made of an oxide film containing Hf, Si, and Zr contains La and Mg, etc. for controlling a work function thereof.

A TiN gate electrode technique is described in Japanese Patent Publication No. 2007-110091. However, physical properties of TiN are not described at all in Japanese Patent Publication No. 2007-110091. When a TiN gate electrode is formed by sputtering, etc., a work function of about 4.7 eV can be realized by forming the TiN to a thickness of about 20 nm. Even when the TiN film is formed to a larger thickness than about 20 nm, the work function is not changed.

In contrast to this, a feature of the semiconductor device 100 of this embodiment is that the work function is improved by causing Cl (chlorine) having a higher electronegativity than that of nitrogen to be eccentrically located at an interface between the TiN electrode and the high-k gate insulating film. Note that Cl is caused to be eccentrically located by forming a metal gate electrode so that the metal gate electrode includes a crystalline portion and an amorphous portion, and causing Cl to exist in the amorphous portion. This point will be described later in detail.

As an example, the composition ratio N/Ti between Ti and N is set to 1.0 or more and 1.2 or less to cause TiN to be in a crystalline state, and then, TiN in a crystalline state is used. Furthermore, the present inventors found that the work function can be increased by increasing an chlorine content in an early stage of film formation by atomic layer deposition (ALD) (for example, in which the TiN film is formed to a thickness of about 5 nm), and applied this technique to a CMOS transistor. The details will be further described below.

Figure 2:
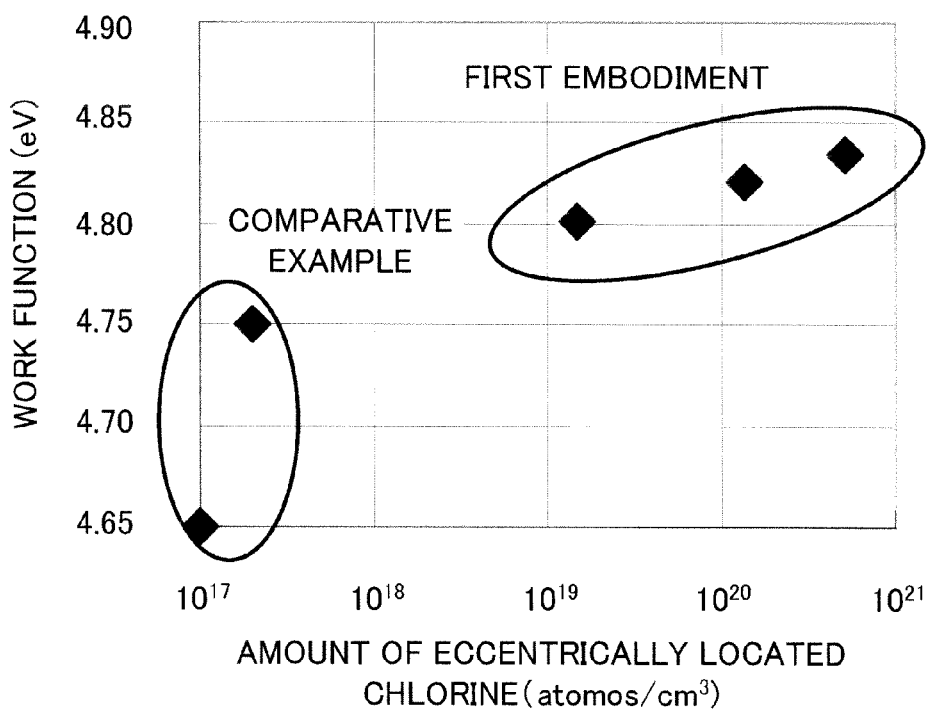
FIG. 2 is a chart showing the relationship between the amount of eccentrically located chlorine in a lower portion of a TiN film and the work function.

FIG. 2 shows the relationship between the concentration of chlorine eccentrically located at the interface between the TiN electrode and the high-k gate insulating film (more precisely, at the TiN electrode side of the interface) and the work function. In a comparative example in which the chlorine concentration at the interface is less than $1 \times 10^{18}$ atoms/cm$^3$, the work function is about 4.7 eV, whereas in this embodiment in which the chlorine concentration is increased to be more than $1 \times 10^{18}$ atoms/cm$^3$ or more, a work function of 4.8 eV or more can be obtained.

Figure 3:
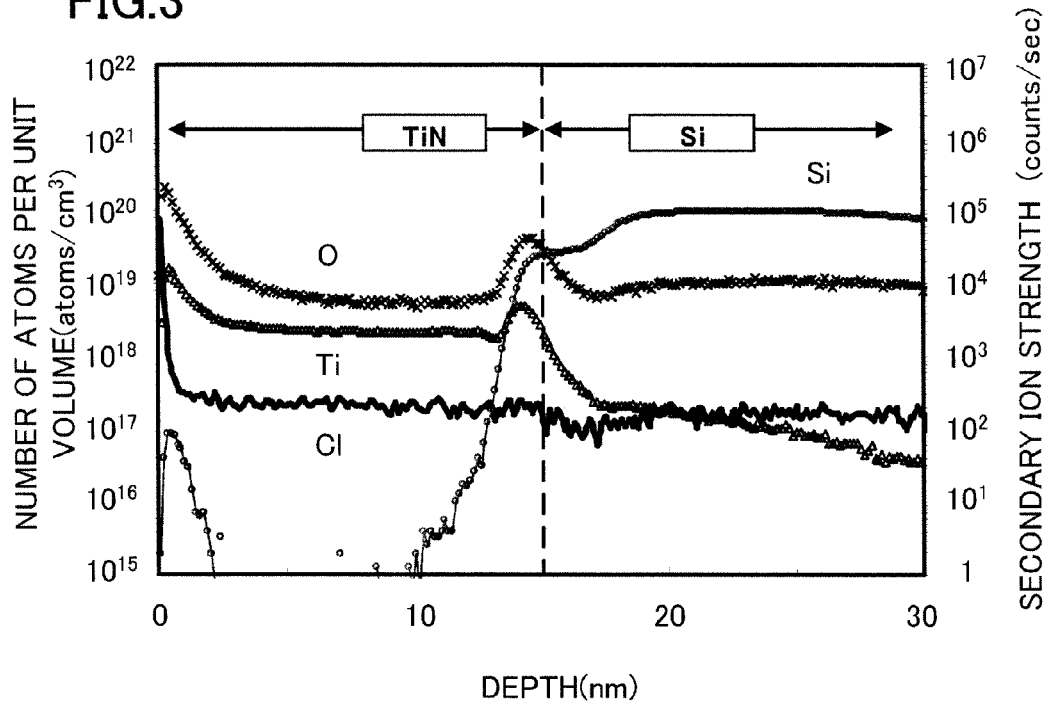
FIG. 3 is a chart showing results of SIMS analysis for the concentration profile of each element in a TiN film having a thickness of 15 nm in depth direction.

FIG. 3 shows results of secondary ion mass spectrometry (SIMS) analysis which was performed to measure the distribution of chlorine in depth direction in a TiN thin film (a film in which treatment for causing chlorine to be eccentrically located was not performed) with a thickness of 15 nm formed on a Si substrate. In a method used to measure the distribution, a primary ionic species of Cs$^+$ was used, and $^{35}$Cl was used to detect Cl. The acceleration energy was 500 eV.

The horizontal axis of FIG. 3 indicates the thickness converted from the sputtering rate, and a part from an upper portion side of the TiN film to a lower portion side thereof is shown from left to right along the horizontal axis. The left vertical axis indicates the number of Cl atoms per unit volume (atoms/cm$^3$), and the right vertical axis indicates the secondary ion strength (counts/sec) for Ti, Si, and O.

As shown in FIG. 3, in TiN in which chlorine is not eccentrically located, a chlorine concentration of about $2 \times 10^{17}$ atoms/cm$^3$, which is equivalent to that of the Si substrate is detected. That is, it is shown that the detection limit of this SIMS measurement is about $2 \times 10^{17}$ atoms/cm$^3$.

Figure 4:
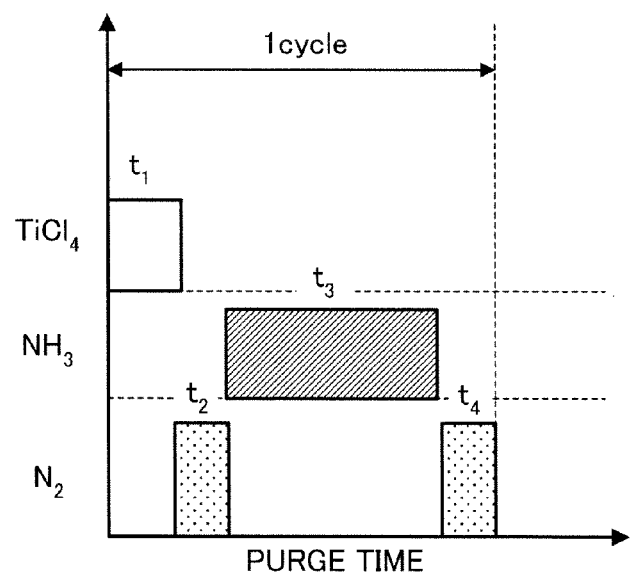
FIG. 4 is a chart showing an example sequence of TiN film deposition according to the first embodiment.

When a TiN film is formed using ALD, as shown in FIG. 4, for example, a Ti source such as titanium chloride (TiCl$_4$), etc., and a nitrogen source such as ammonium (NH$_3$), etc. are alternately supplied via an inert gas, i.e., N$_2$. In other words, a set of supply of the Ti source, supply of the inert gas, supply of the nitrogen source, and supply of the inert gas is repeated as one cycle. Thus, atomic layer deposition is repeated to form the TiN film. When an ALD-TiN film is formed using such source gases, not to cause vapor phase deposition and obtain a sheet resistance of 100Ω/□ or less which is in a working range, the film formation temperature range is preferably about 400-600° C.

Figure 5:
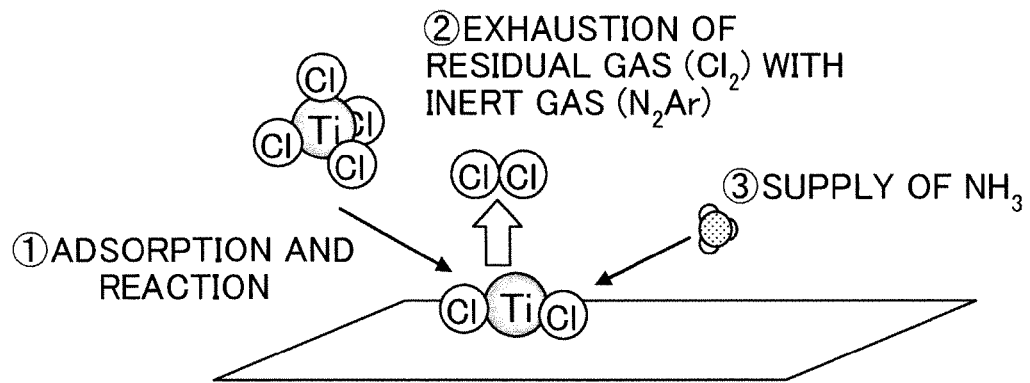
FIG. 5 is a schematic diagram illustrating an adsorption process for $TiCl_4$ and $NH_3$.

However, at 400-600° C., the chlorine concentration in the TiN film cannot be dynamically changed. Therefore, to increase the chlorine concentration, the ALD cycle is adjusted to reduce decomposition of TiCl$_4$. When the cycle shown in FIG. 4 is performed, as shown in FIG. 5, TiCl$_4$ is thermally decomposed to be adsorbed to a surface of the substrate, and furthermore, a chemical reaction between Ti dangling bonds and the surface of the substrate occurs to combine Ti dangling bonds to the surface of the substrate.

Thereafter, a residual gas (Cl$_2$) is exhausted using an inert gas such as Ar and N$_2$, etc., and then, NH$_3$ which is to serve as a nitrogen source is supplied.

Figure 6:
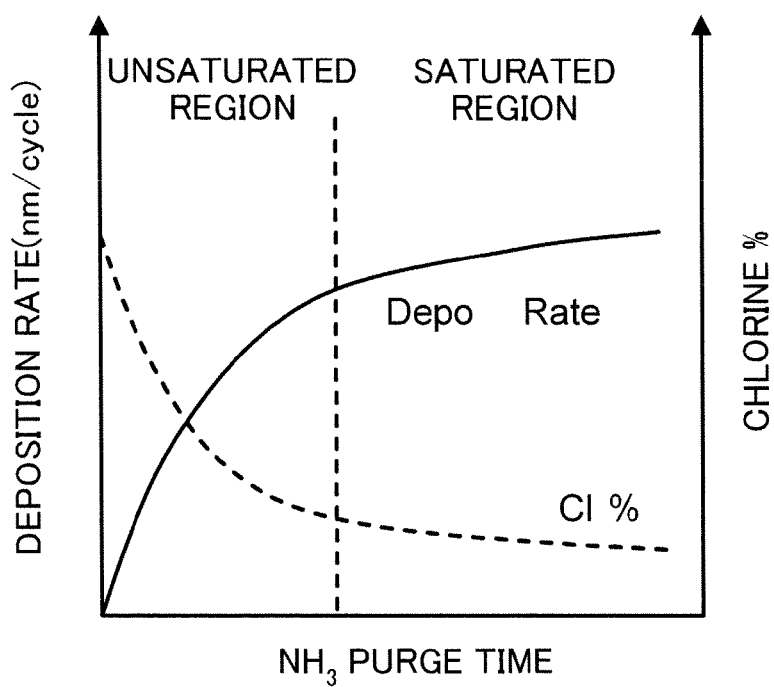
FIG. 6 is a graph showing the deposition rate and the chlorine percentage relative to the $NH_3$ purge time during an ALD cycle.

In this case, as shown in FIG. 6, a time for which NH$_3$ is supplied is adjusted so that a NH$_3$ reaction is not saturated. For example, the time for which NH$_3$ is supplied is 1 second or less. Also, the time for which NH$_3$ is supplied is preferably one tenth of an NH$_3$ purge time which causes the reaction to reach a saturation state. Thus, the concentration of chlorine remaining in TiN can be controlled. Note that the concentration of chlorine can be also controlled by reducing the flow rate of a NH$_3$ gas.

In view of film thickness uniformity, the pressure in a film formation chamber is most preferably 0.3-3 Torr (40-400 Pa). If only pressure conditions are changed in this range, the chlorine concentration cannot be dynamically changed.

Figure 7A:
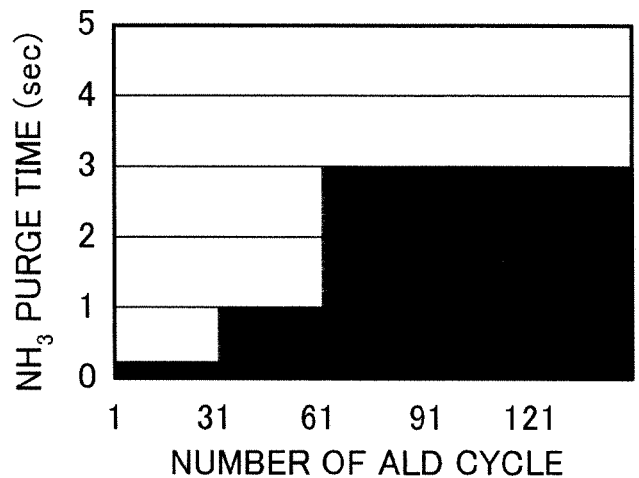
FIG. 7A is a chart showing an example ALD cycle according to the first embodiment.

FIG. 7A shows an ALD sequence for causing chlorine to be eccentrically located at the interface between the TiN electrode and the high-k gate insulating film. The horizontal axis indicates the number of cycles (150 cycles in this case) of film formation, the vertical axis indicates a time for which ammonia purge is performed. The ALD-TiN deposition rate is very low, i.e., 0.1 nm/cycle. Therefore, for example, if an ALD-TiN film is desired to be deposited to 15 nm, 150 cycles or more is needed.

As shown in FIG. 7A, in the early stage of film formation, an NH$_3$ purge time is reduced to 0.2 seconds, and thereby, a reaction between TiCl$_4$ and NH$_3$ is put in a non-saturated state to increase residual chlorine in the TiN film.

However, when TiN containing a high concentration of chlorine is deposited to 15 nm, a resistance value which the TiN film as a metal gate electrode is required to have cannot be achieved. That is, as a TiN metal gate electrode, a resistance value has to be 100Ω/□ or less at most in terms of sheet resistance. For this reason, it is not desired that a layer having a high concentration of chlorine and a high resistance has a large thickness. Therefore, the TiN layer having a thickness of about 0.5-5 nm in the early stage of film formation is caused to contain a high concentration of chlorine.

As described above, the present inventors found that, by arranging an ALD sequence so that chlorine is eccentrically located in the early stage of film formation, chlorine can be eccentrically located at high concentration at the interface between the TiN electrode and the high-k gate insulating film.

Figure 7B:
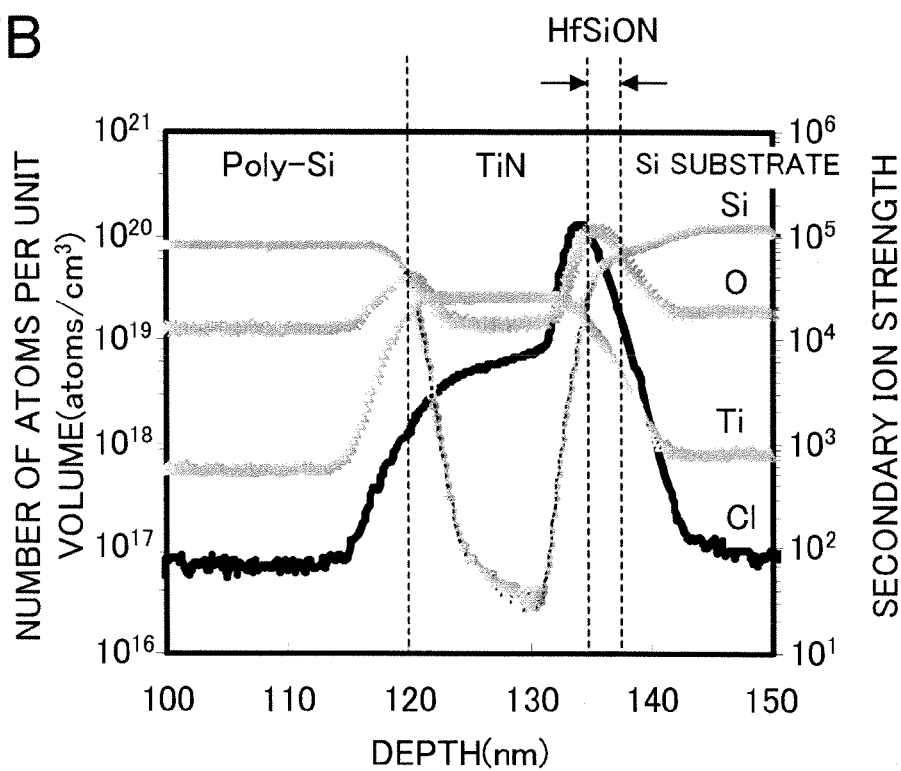
FIG. 7B is a chart showing SIMS profile for MOS capacitor in which a film is formed using the ALD cycle.

FIG. 7B shows results of SIMS measurement using the above-described method for a MOS capacitor formed by forming a TiN film with a thickness of 15 nm on a high-k gate insulating film formed on a Si substrate and made of HfSiON, depositing poly-Si thereon, and performing activation annealing at 1000° C. for 1 second. The same measurement method was used as that for measurement of which results are shown in FIG. 3, and the horizontal axis is provided in the same manner as in FIG. 3. Along the horizontal axis, a part extending from an upper portion of poly-Si to the Si substrate is shown from the left side to the right side.

In FIG. 7B, circles (○) indicate Si strength, triangles (Δ) indicate Ti strength, and crosses (×) indicate oxygen strength. A black solid line indicates the chlorine concentration in the film.

Let us focus on the profile of the chlorine concentration in depth direction indicated by the black solid line. A peak of the chlorine concentration appears before an oxygen peak resulting from the high-k gate insulating film appears. This shows that chlorine is eccentrically located at the TiN gate electrode side of the interface between the TiN gate electrode and the high-k gate insulating film (the lower portion of the TiN gate electrode). Also, the peak concentration is high, i.e., $1 \times 10^{20}$ atoms/cm$^3$ or more in the lower portion of the TiN gate electrode in which chloride is eccentrically located, but the peak concentration is relatively constant, i.e., about $4 \times 10^{18}$ atoms/cm$^3$ in upper and middle portions of the TiN gate electrode. The above-described method for changing the profile of the chlorine concentration in depth direction in a TiN film has been realized by the present inventors.

Note that as a method for forming a TiN film, in addition to ALD, metal organic chemical vapor deposition (MOCVD) and physical vapor deposition (PVD), etc. may be used. However, for the purpose of controlling a layer with a thickness of 5 nm or less in which chlorine is eccentrically located, the above-described ALD is more preferable because ALD allows control of an atomic layer.

The relationship between the concentration of eccentrically located chlorine in the lower portion of the TiN gate electrode and the work function is as shown in FIG. 2.

It is known that the work function of TiN greatly depends on its thickness, and the work function is saturated when the thickness of TiN is abound 15 nm. In contrast, when chlorine which has a higher electronegativity, i.e., 3.16, than that of nitrogen, i.e., 3.04, is eccentrically located at the interface between the gate electrode and the high-k gate insulating film, the work function can be further increased (whereas if there is no chloride, the work function is saturated).

However, the amount of eccentrically located chlorine is also saturated when it is about $1 \times 10^{21}$ atoms/cm$^3$. Even when a larger amount than the above-described amount is eccentrically located, it is likely that chlorine is be diffused by annealing, etc. performed in a subsequent step. That is, there is a limit of the amount of chlorine that can be eccentrically located. Accordingly, there is a limit of increase in work function, and the work function can be increased to 4.85 eV.

In the SIMS analysis shown in FIG. 7B, a MOS capacitor formed on a wafer to be 2 mm square was evaluated, and the work function was evaluated for a MOS capacitor formed on the same wafer to be 0.01 mm square. This is because in a SIMS analysis, a spot of at least about 1 mm square is needed to improve the secondary ion strength. For this reason, it is difficult to evaluate a TiN gate electrode in a transistor having a gate length of 50 nm or less by SIMS analysis. However, in recent years, it has become possible to easily observe an element eccentrically located in a transistor structure using an atom probe microscope.

Figure 8A:
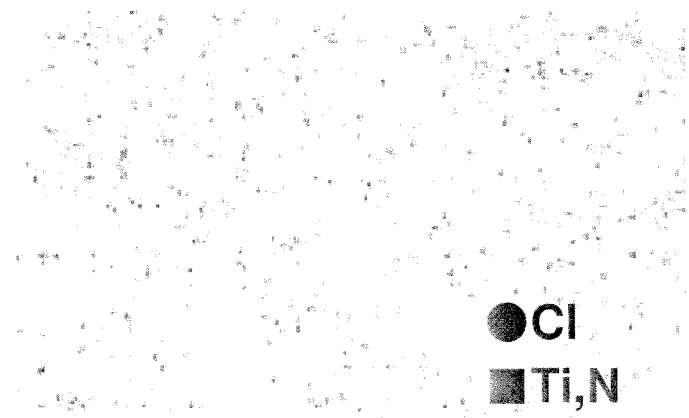
FIG. 8A is a distribution map of chlorine in TiN observed using an atom probe microscope.
Figure 8B:
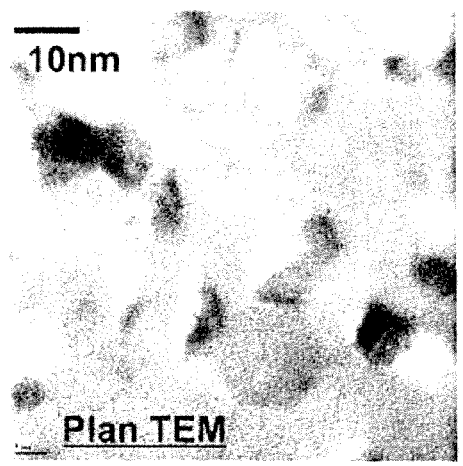
FIG. 8B shows crystal grains of TiN observed using TEM.
Figure 8C:
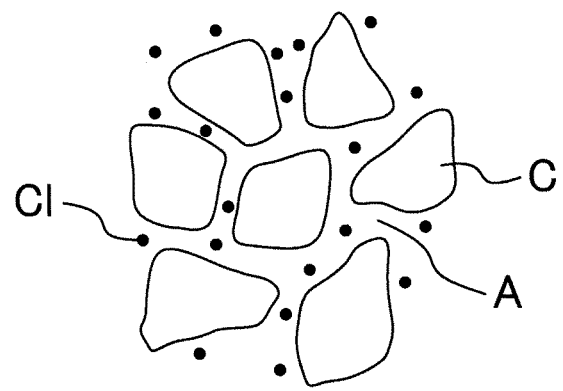
FIG. 8C is a schematic diagram illustrating the Cl distribution of FIG. 8A.

FIG. 8A shows a two-dimensional view of TiN observed using an atom probe microscope. FIG. 8B shows a two-dimensional view of TiN using TEM, and it can be seen that TiN has a crystal grain boundary. In FIG. 8A, chlorine is indicated by circles (●), Ti and N are indicated by small squares (■). A part with light color indicates a crystalline state, and a part with dark color indicates an amorphous state. It has become clear that chlorine localizes to the parts in an amorphous state, and exists at the crystal grain boundary. This is schematically shown by FIG. 8C. That is, there are parts C which are in a crystalline state and a part A which is in an amorphous state, and chlorine atoms Cl localize to the part A in an amorphous state, which is a crystal boundary.

Based on the foregoing, it is understood that, when the amount of eccentrically located chlorine in TiN increases, chlorine is in a crystal boundary. Increasing the amount of eccentrically located chlorine by reducing a time of ammonia purge as in the above-described example of this embodiment means the same as relatively increasing the crystal gain boundary where chlorine can exist by reducing the crystal grain size of TiN.

As described above, a higher work function than the work function realized by TiN in which chlorine is not eccentrically located can be achieved by causing chlorine to be eccentrically located at the interface between the TiN gate electrode and the high-k gate insulating film. Since such a high work function can be achieved, the amount of flat band shifts is increased, and thus, the threshold voltage can be adjusted easily in a p-channel transistor.

Next, a method for fabricating a semiconductor device 100 will be described with reference to FIGS. 9A-9D which are cross-sectional views schematically illustrating respective steps for fabricating the semiconductor device 100.

Figure 9A:
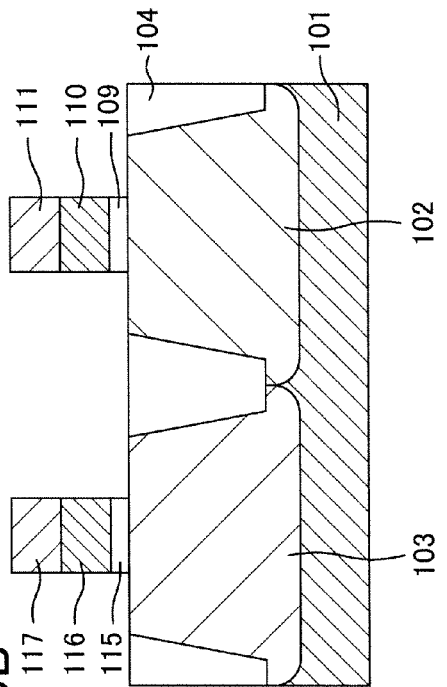
FIGS. 9A-9D are cross-sectional views illustrating respective steps for fabricating a semiconductor device according to the first embodiment.

First, as shown in FIG. 9A, an n-type well region 102 and a p-type well region 103 are formed in a silicon substrate 101 so that the n-type well region 102 and the p-type well region 103 are isolated from each other by an isolation layer 104 made of a silicon oxide film in the form of STIs. Furthermore, a high dielectric film 151 and a TiN film 152 are deposited over the n-type well region 102 and the p-type well region 103 in this order.

The high dielectric film 151 is formed as a high-k gate insulating film made of a high-k material, and is stacked on a silicon oxide film formed by oxidizing the silicon substrate 101, for example, with water vapor and a nitric oxide atmosphere. As the high-k material, for example, an oxide containing a group 4 element such as Hf and Zr, etc. as a main constituent may be used. Also, an oxide of Hf or Zr, etc. and Si, which is called "silicate" may be used. An oxide of Hf or Zr, etc. and Al, which is called "aluminate" may be also used. Furthermore, oxynitride obtained by adding nitrogen to any one of the above-described materials using plasma nitridation and ammonia nitridation, etc. may be used.

Also, MOCVD, ALD, and PVD etc. may be used to form the above-described high-k gate insulating film. If nitridation is performed, thermal treatment at 1000° C. or higher is preferably performed.

Note that to control a threshold voltage, different high-k materials are preferably mixed into the high dielectric gate insulating films of the n-channel and the p-channel, respectively. It is preferable, that, for example, LaO and/or MgO, etc. are/is mixed into the high-k dielectric gate insulating film of the n-channel, and AlO and/or TaO, etc. are/is mixed into the high-k dielectric gate insulating film of the p-channel.

Figure 10:
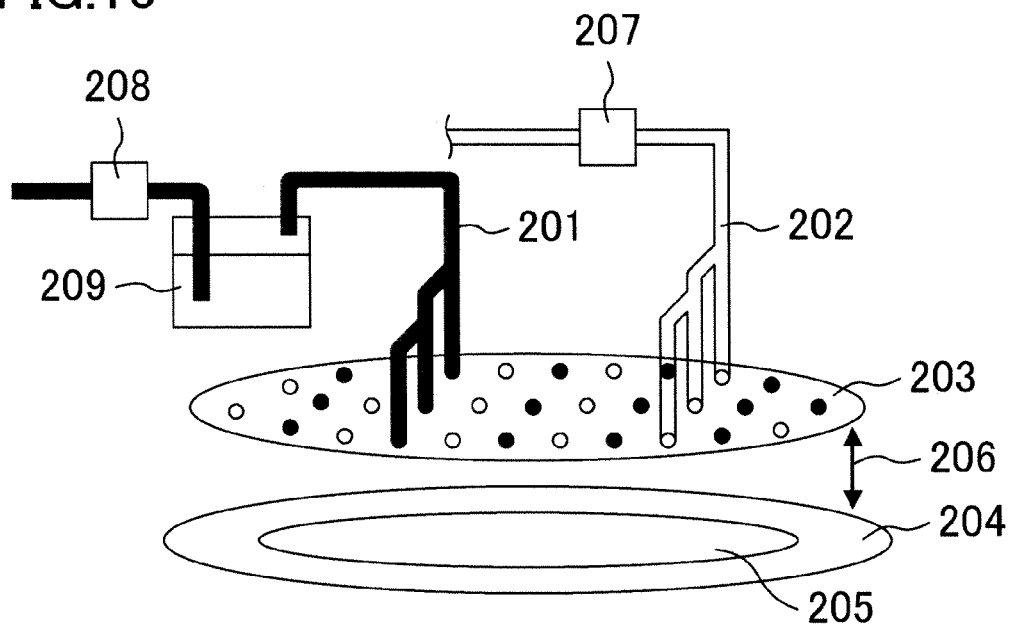
FIG. 10 is a schematic diagram illustrating an example semiconductor device according to the first embodiment.

Next, formation of the TiN film 152 will be described. The TiN film 152 is formed by ALD using a batch-type film formation apparatus whose main portion is schematically illustrated in FIG. 10. In the batch-type film formation apparatus of FIG. 10, a shower plate 203 having a plurality of gas supply ports (201 and 202) is arranged in parallel to a stage heater 204 to which a substrate 101 is provided. As the gas supply ports, Ti source gas supply ports 201 and nitrogen source gas supply ports 202 are independently provided. Furthermore, mass flow controllers 208 and 207 which respectively adjust flow rates of a Ti source gas and a nitrogen source gas, and a liquid gas bubbler cabinet 209 which bubbles through a liquid source.

A distance 206 between the stage heater 204 and the shower plate 203 is variable, for example, in a range from 5 mm to 50 mm, and a volume of the inside of a chamber can be freely changed by changing the distance 206.

When each of the source gases is supplied, the flow rate and gas supply time are controlled by a differential pressure control valve which opens and closes at intervals of 0.01 seconds or more (for example, at intervals of 0.01-0.5 seconds, when the distance 206 is 5-50 mm) to control supply of the source gas. For example, a film controlled to the atomic layer level can be formed by repeating the gas supply cycle of FIG. 4. Moreover, since switching of gas has to be performed at very high speed, the volume of the chamber is preferably as small as possible. Thus, the volume of the chamber is optimally set according to the type of films, etc. by changing the distance 206 between the stage heater 204 and the shower plate 203.

For example, to supply a gas, a liquid source such as titanium chloride (TiCl$_4$) etc. as a Ti source is vaporized by bubbling the liquid source using an inert gas such as Ar, etc. A vaporized TiCl$_4$ gas is supplied into the chamber for t1=0.05 seconds (FIG. 4) to cause Ti to be adsorbed on the high-k gate insulating film.

Next, to exhaust the TiCl$_4$ gas filled in the chamber, for example, a nitrogen gas is supplied at a flow rate of 1000 sccm (ml/minute in a normal state) only for t2=0.3 seconds. Subsequently, ammonia as a nitrogen source gas is supplied, for example, at a flow rate of 1000 sccm only for t3=1 second. Thus, ammonia is bonded to Ti already adsorbed to the high-k gate insulating film.

Thereafter, to remove the ammonia gas filled in the chamber, nitrogen is supplied at a flow rate of 1000 sccm only for t2=0.3 seconds.

A thickness of a film deposited by one cycle of a series of gas supply which has been described above is referred to as a "depo rate" or a "film formation rate".

As shown in FIG. 7A, the $NH_3$ purge time is set to be 0.2 seconds for a period from a start of film formation to the 30th cycle, 1 second for the $31^{st}$ cycle to the 60th cycle, and 3 seconds for the $61^{st}$ and subsequent cycles, and a TiN film is deposited. Thus, the TiN film 152 having a Cl profile in TiN shown FIG. 7B is formed.

Figure 9B:
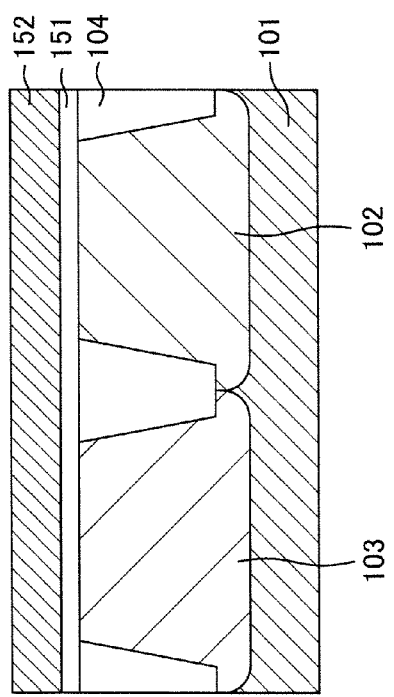

Next, a step shown in FIG. 9B is performed. First, to remove a natural oxide film formed on the TiN film 152 and the TiN layer which has been altered by application and removal of a resist, etc., a surface of the TiN film 152 is cleaned using a hydrogen peroxide solution. Subsequently, a polysilicon film which is to be formed into polysilicon electrodes 111 and 117 is formed on the TiN film 152 to have a thickness of 100 nm. Since an interface resistance increases when an oxide layer exists at an interface between the TiN film 152 and the polysilicon film, the above-described cleaning using a hydrogen peroxide solution is preferably performed.

The polysilicon film may be formed by forming a film, for example, using silane ($SiH_4$) and disilane ($Si_2H_6$) at a temperature of 500-550° C., and then, performing thermal treatment to the film to obtain a polysilicon film. Moreover, a method in which polysilicon is formed at 600-630° C. may be used. Furthermore, an electrode made of silicon germanium, instead of polysilicon, may be formed using silane and germane ($GeH_4$).

Next, a gate electrode resist pattern (not shown) is formed using a photolithography technique and an etching technique. Subsequently, anisotropic etching is performed to the polysilicon film and the TiN film using a halogen-based etching gas. Thereafter, residual polymer which has been left after etching for forming gate electrodes and a part of the high dielectric film 151 other than necessary parts thereof located under the gate electrodes are removed by fluorine cleaning. Thus, a gate insulating film 109, a TiN electrode 110, and a polysilicon electrode 111 are formed in the n-type well region 102, and a gate insulating film 115, a TiN electrode 116, and polysilicon electrode 117 are formed in the p-type well region 103.

Figure 9C:
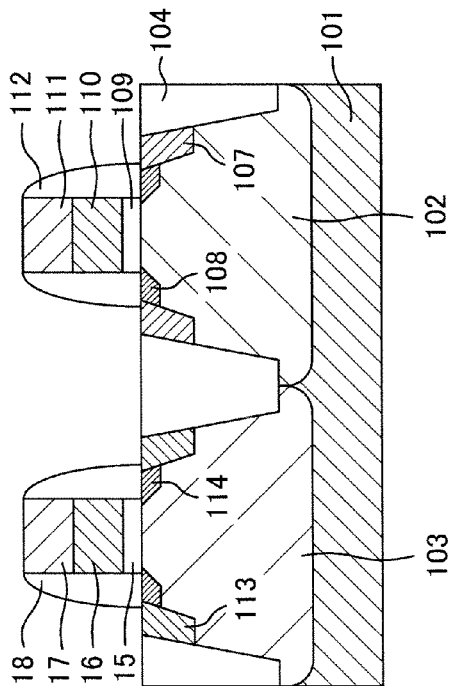

Next, a step of FIG. 9C is performed. First, a silicon nitride film is formed at a film formation temperature of 600° C. or less (not shown). In this step, it is most preferable to use ALD. For example, dichlorosilane ($SiH_2Cl_2$) and ammonia are alternately supplied, thereby forming a film to a thickness of 5-10 nm. Subsequently, anisotropic dry etching is performed using a halogen-based gas to leave the silicon nitride film only on side walls of the gate electrodes (not shown).

Thereafter, with the n-type well region 102 protected by a resist, an n-type impurity such as phosphorous, arsenic, and antimony, etc. is ion-implanted to the p-type well region 103. Subsequently, the resist on the n-type well region 102 is removed. Thereafter, this time, with the p-type well region 103 protected by a resist, a p-type impurity such as boron and indium, etc. is ion-implanted to the n-type well region 102, and thermal treatment is performed thereto at 1000° C. or more to activate ion species. Thus, an n-type extension layer 114 and the p-type extension layer 108 are formed.

Figure 9D:
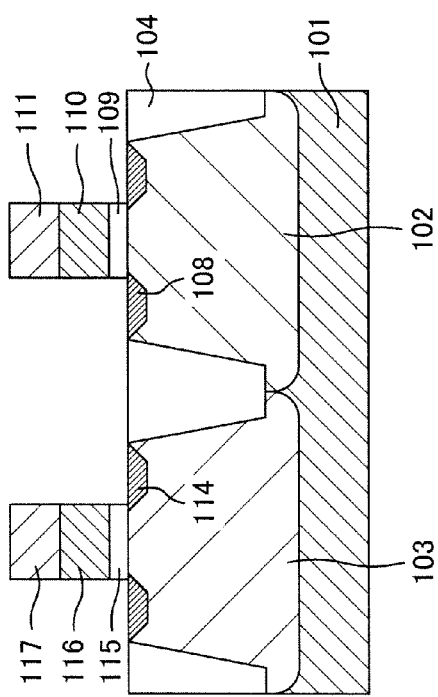

Next, a step of FIG. 9D is performed. First, a silicon oxide film with a thickness of 5-10 nm and a silicon nitride film with a thickness of 10-30 nm are stacked. Subsequently, anisotropic dry etching is performed to form sidewalls 112 and sidewalls 118 on side walls of the gate electrodes in the n-type well region 102 and the p-type well region 103. However, the sidewalls do not have to be formed in a two-layer structure, but may be formed in a single layer structure of a silicon oxide film or a single layer structure of a silicon nitride film.

Next, with an upper portion of the n-type well region 102 protected by a resist, an n-type impurity such as phosphorous, arsenic, and antimony, etc. is ion-implanted to form a n-type diffusion layer 113. Subsequently, the resist on the n-type well region 102 is removed, and a resist is formed to protect the p-type well region 103, instead. In this state, a p-type impurity such as boron and indium, etc. is ion-implanted, thereby forming a p-type diffusion layer 107. Thereafter, ion species in the n-type diffusion layer 113 and the p-type diffusion layer 107 are activated at 900-1050° C., thereby forming source/drain regions.

Thereafter, upper portions of the source/drain regions, and upper portions of the polysilicon electrodes 111 and 117 are silicided using Ni and Pt. Also, a silicon nitride film (not shown) which is to serve as a contact hole etching stopper and a silicon oxide film which is to serve as an interlevel insulation film (not shown) are formed, and usual steps such as planarization, etc. are performed, thereby forming a semiconductor device 100.

Second Embodiment

A semiconductor device, and an apparatus and a method for fabricating a semiconductor device according to a second embodiment will be described with reference to the accompanying drawings.

Figure 11:
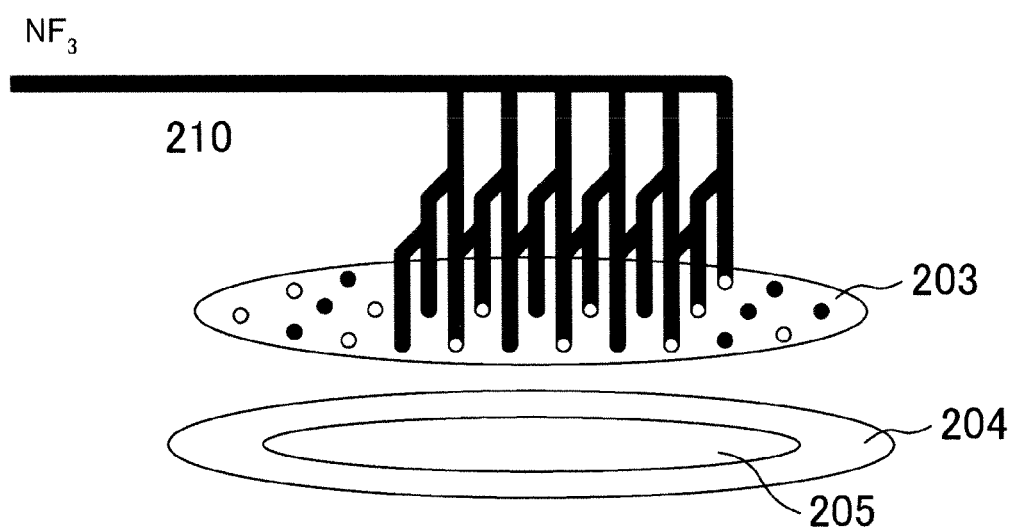
FIG. 11 is a schematic diagram illustrating an example semiconductor device according to a second embodiment.

FIG. 11 is a view schematically illustrating features of an apparatus for fabricating a semiconductor device used in this embodiment. Similar to the apparatus of FIG. 10, the apparatus is a batch-type film formation apparatus, and a main feature of the apparatus used in this embodiment is that a fluorine-based gas such as $NF_3$ and $F_2$, etc. can be introduced. The fluorine-based gas can be supplied through a plurality of gas supply openings 201 and 202 of a shower plate 203, and is supplied at pressure and temperature which are set in consideration of vapor pressure of fluoride of TiN. Note that, although not shown in FIG. 11, the apparatus is configured to be capable of supplying a Ti source gas and a nitrogen gas.

In this embodiment, a chamber is filled with fluorine each time when TiN is deposited on a wafer, thereby taking residual fluorine left in the chamber when a TiN film was formed into the TiN film. Thus, fluorine whose electronegativity is higher than that of chlorine, i.e., 3.98 can be introduced at an interface between a high-k gate insulating film and a TiN gate electrode. As a result, the work function of the TiN gate electrode can be increased.

Figure 12:
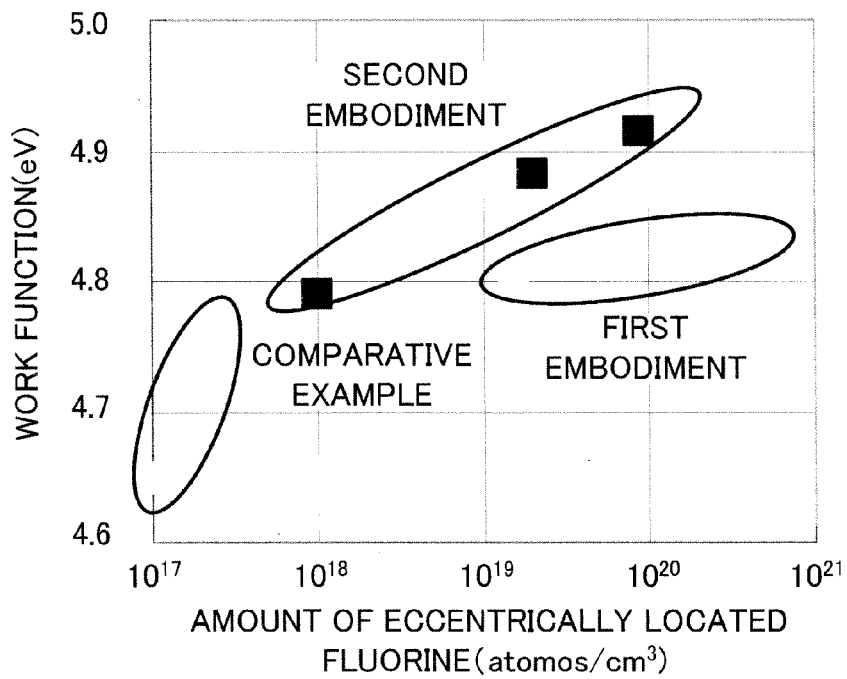
FIG. 12 is a chart showing the relationship between the amount of eccentrically located fluorine in a lower portion of a TiN film and work function.

FIG. 12 shows the relationship between the concentration of fluorine eccentrically located at the interface between the TiN electrode and the high-k gate insulating film and the work function. In a comparative example in which the fluorine concentration at the interface is $1 \times 10^{18}$ atoms/cm$^3$ or less, the work function is 4.8 eV or less, whereas in this embodiment in which the fluorine concentration is increased to $1 \times 10^{18}$ atoms/cm$^3$ or more, a work function of about 4.9 can be achieved. Note that FIG. 12 also shows the relationship between the fluorine concentration and the work function for the first embodiment (in which chlorine is eccentrically located).

Figure 13:
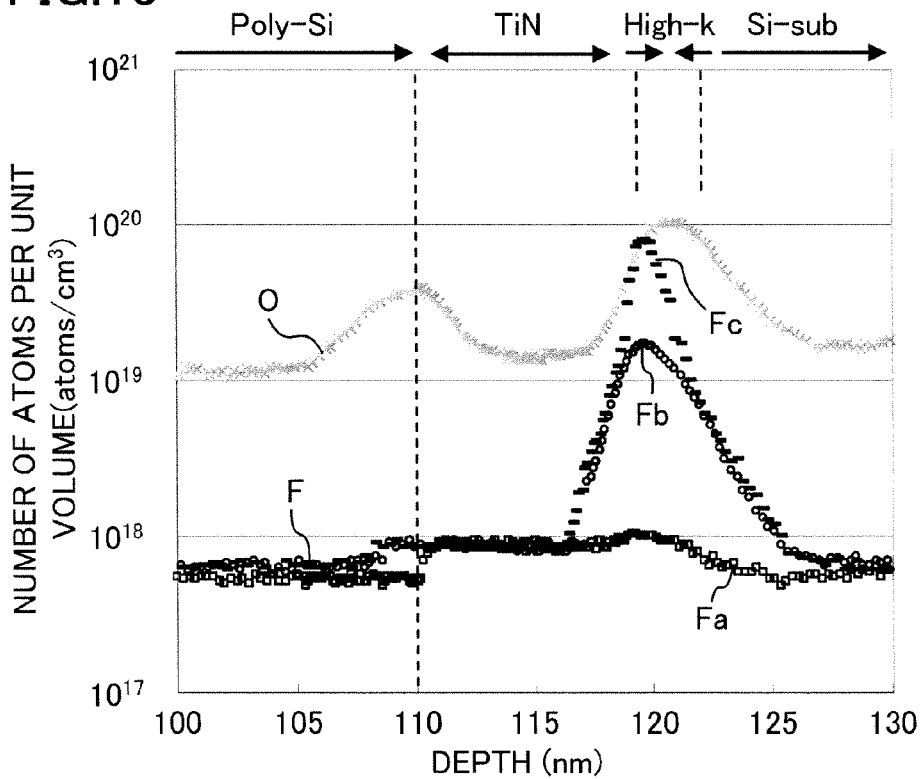
FIG. 13 is a chart showing concentration profiles of elements in a TiN film formed in the second embodiment in depth direction.

FIG. 13 shows results of SIMS measurement performed to measure the distribution of fluorine in depth direction in a TiN thin film with a thickness of 10 nm. More specifically, results of SIMS measurement for a structure in which a TiN film is formed on a silicon substrate with a high-k gate insulating film interposed therebetween, and a poly-Si film is formed thereon are shown. In a method used to measure the distribution, a primary ionic species of $Cs^+$ was used, and $^{19}F$ was used to detect F. The acceleration energy was 500 eV.

The horizontal axis of FIG. 13 indicates the thickness converted from the sputtering rate, and a part extending from an upper portion side of the TiN film to a lower portion side thereof is shown from left to right along the horizontal axis. The left vertical axis indicates the number of atoms per unit volume (atoms/cm$^3$) for fluorine and oxygen.

There are two peaks for oxygen. One of the peaks is located in the high-k gate insulating film made of a material containing oxygen. The other one of the peaks is located at the interface between the poly-Si film and the TiN film, which is generated when the TiN film is naturally oxidized.

Results for three cases, i.e., Fa, Fb, and Fc are shown for F. The peak position for eccentrically located fluorine (for Fa and Fb) is shifted to the TiN film side relative to the peak position of oxygen in the high-k gate insulating film. This indicates that fluorine was eccentrically located in the lower portion of TiN.

Fa indicates the profile of fluorine in depth direction when fluorine was not introduced, and a film was formed by ALD using TiCl$_4$ and NH$_3$. In this case, only about $1\times10^{18}$ atoms/cm$^3$ of fluorine was contained.

Fb indicates the profile of fluorine in depth direction when NF$_3$ of 200 sccm was supplied into a chamber under the condition where the heater temperature was 550° C. and the chamber pressure was 0.3 Torr (40 Pa) to fill the chamber with a fluorine atmosphere, and then, a TiN film was formed by ALD. In this case, about $2\times10^{19}$ atoms/cm$^3$ of fluorine was eccentrically located at the interface between the TiN film and the high-k gate insulating film.

Figure 14:
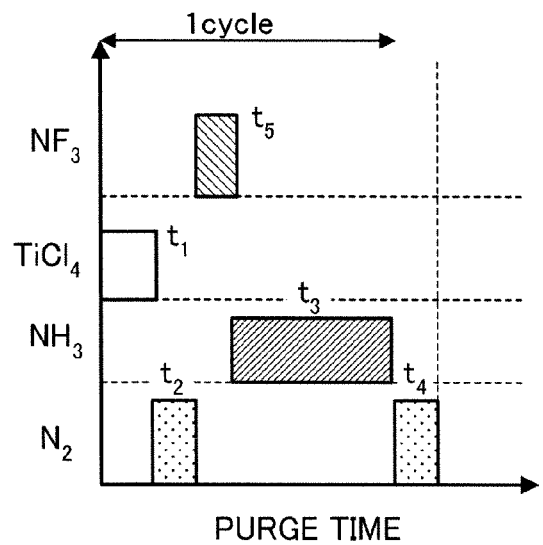
FIG. 14 is a diagram showing an ALD sequence of TiN film deposition in the second embodiment.

Fc indicates the profile of fluorine in depth direction when in order to fill the chamber with fluorine at a higher concentration, a gas was supplied in the manner shown in FIG. 14 (in which after purging TiCl$_4$, NF$_3$ was purged for 0.1 seconds between purging of N$_2$ and purging of NH$_3$) in an early stage of film formation, i.e., in the initial 10 cycles (for example, preferably in which the film thickness is 5 nm or less). In this case, by controlling the chamber temperature to 500° C. and the chamber pressure to 0.3 Torr (40 Pa), fluorine is only adsorbed, and thus, fluorine is not vaporized as a Ti fluoride. Thus, a residual fluorine layer can be formed. After the early stage of film formation, ALD film formation was repeated using the cycle of FIG. 4. Note that the present inventors found that to cause fluorine to be eccentrically located, it is preferable to purge NF$_3$ with the timing shown in FIG. 14.

As described above, the work function can be increased by causing fluorine to be eccentrically located at the interface between the TiN film (TiN electrode) and the high dielectric gate insulating film (more precisely, at the TiN electrode side of the interface).

Furthermore, in the semiconductor device of this embodiment, NBTI degradation due to reduction in interface state between the high-k gate insulating film and the Si substrate resulting from large internal stress of the TiN electrode can be improved. This will be described below.

Figure 15:
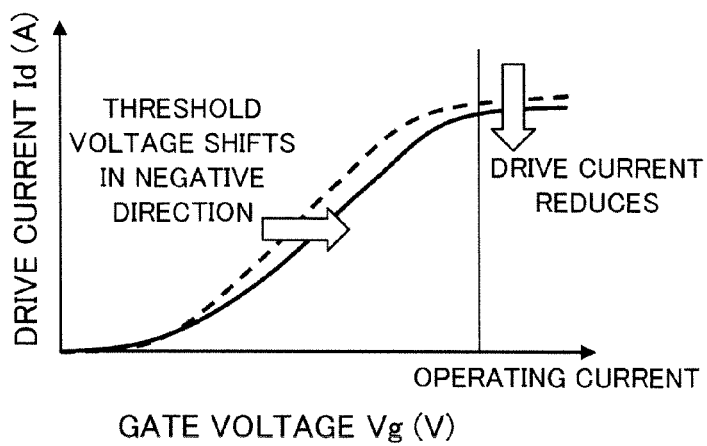
FIG. 15 is a graph showing reduction in drive current due to NBTI degradation.

As shown in FIG. 15, NBTI is a phenomenon in which when the PMOS transistor is turned on, the threshold voltage of the transistor is shifted in the negative direction, as the high-k gate insulating film itself is degraded, and also as the interface between the high-k gate insulating film and the Si substrate is degraded. When NBTI occurs, a problem arises in which a drive current while the PMOS transistor is operated is reduced by the shift of the threshold voltage, and the performance of the PMOS transistor is reduced.

It has been known that NBTI depends on an electric filed applied to a gate insulating film, and a time and a temperature for which and at which the electric field is applied to the gate insulating film. Utilizing this characteristics of NBTI, an acceleration test is performed to estimate the amount of degradation under an actual working condition, and thus, the life of the transistor can be predicted.

As described in Japanese Patent Publication No. 2008-305950, in a SiON/poly-Si gate structure, NBTI is improved by injection of fluorine into a Si substrate and injection of fluorine into a poly-Si gate electrode. However, in a structure in which a metal gate electrode of TiN etc. is used, even when fluorine is injected from the poly-Si gate electrode on the TiN gate electrode, injection of fluorine into the Si substrate is inhibited by the metal gate electrode. Therefore, the advantage of improving NBTI degradation cannot be obtained as expected.

Figure 16:
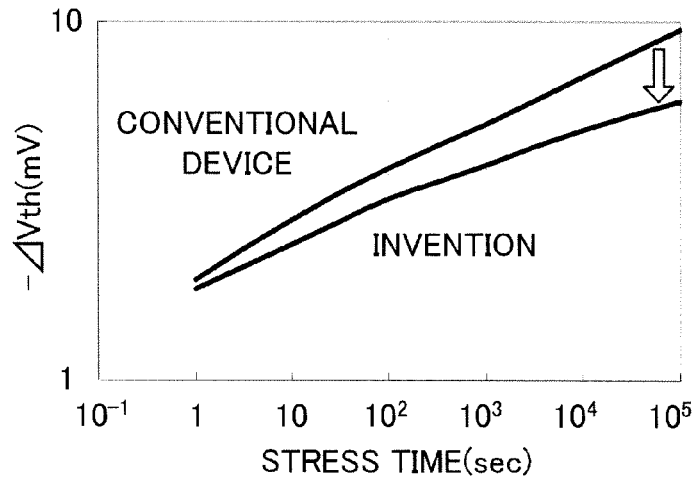
FIG. 16 is a graph showing results of improvement of NBTI in the second embodiment.

In contrast, using the apparatus for fabricating a semiconductor device according to this embodiment, a high concentration of fluorine is eccentrically located at the interface between the TiN electrode and the high-k gate insulating film, and thus, as shown in FIG. 16, the NBTI degradation can be improved. This is because reduction in interface state between the high-k gate insulating film and the Si substrate caused by a defect in the high-k gate insulating film and large internal stress of the TiN electrode can be prevented or reduced by causing fluorine to be eccentrically located.

As described above, using the apparatus for fabricating a semiconductor device according to this embodiment, a higher work function than the saturated work function of a conventional TiN electrode can be obtained, and the NBTI degradation can be improved.

Third Embodiment

Figure 17:
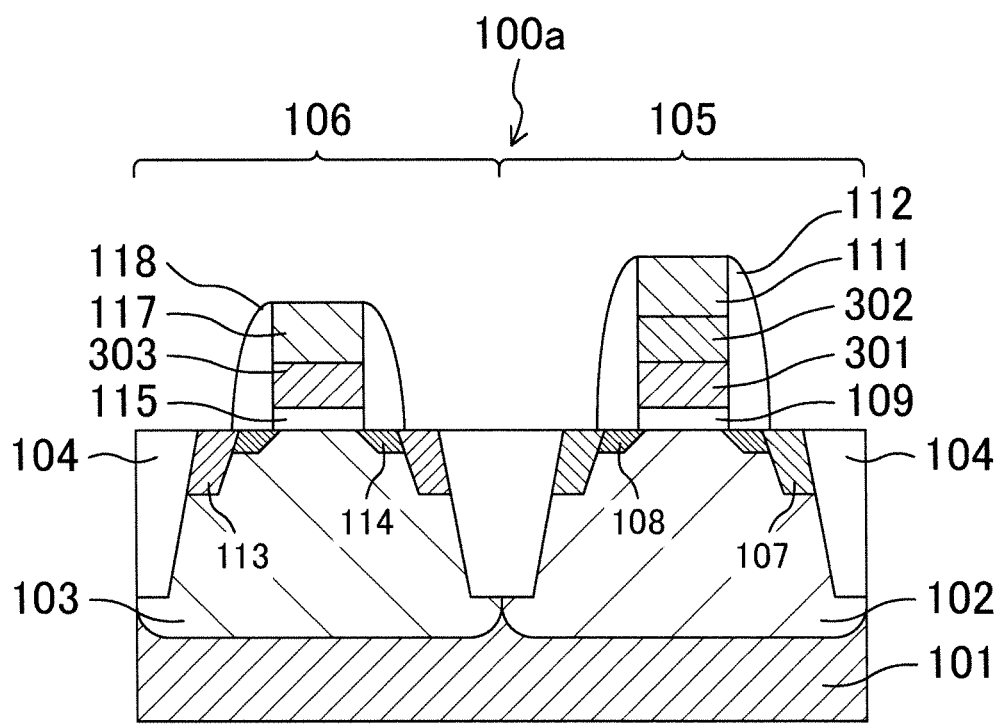
FIG. 17 is a cross-sectional view illustrating a schematic configuration of an example semiconductor device according to a third embodiment.

A semiconductor device, and an apparatus and a method for fabricating a semiconductor device according to a third embodiment will be described with reference to the accompanying drawings. FIG. 17 is a cross-sectional view schematically illustrating a structure of an example semiconductor device 100a according to this embodiment.

The semiconductor device 100a of this embodiment shown in FIG. 17 has a similar structure as that of the semiconductor device 100 of the first embodiment shown in FIG. 1. Therefore, each member also shown in FIG. 1 is identified by the same reference character, and only differences from the semiconductor device 100 of the first embodiment will be described in detail below.

One of differences of the semiconductor device 100a of FIG. 17 from the semiconductor device 100 of FIG. 1 is that a gate electrode made of TiN has a two-layer structure in a p-channel transistor 105 provided in an n-type well region 102. That is, a lower layer TiN electrode 301, an upper layer TiN electrode 302, and a poly silicon electrode 111 are stacked in this order from the bottom on a gate insulating film 109 serving as a high-k gate insulating film of the p-channel transistor 105.

The upper layer TiN electrode 302 is similar to a TiN electrode 303 in an n-channel transistor 106 in the point that the upper layer TiN electrode 302 and the TiN electrode 303 do not contain fluorine and chlorine and have the same thickness. As opposed to this, the lower layer TiN electrode 301 is similar to the TiN electrode described in the first embodiment and the second embodiment, i.e., in the lower layer TiN electrode 301, a halogen element which increases the work function is eccentrically located at the interface between the lower layer TiN electrode 301 and the gate insulating film 109.

In the TiN electrode having the above-described stacked structure, the amount of the halogen element eccentrically located at the interface between the gate insulating film 109 and the lower layer TiN electrode 301 greatly affects the work function.

As opposed to the p-channel transistor 105, it is desired to reduce the work function in the n-channel transistor 106. Therefore, the TiN electrode in the n-channel transistor 106 does not have to contain a halogen element, and it is suitable to use a TiN electrode formed by sputtering, etc.

Next, a method for fabricating the semiconductor device 100a will be described with reference to FIGS. 18A-18D which are cross-sectional views schematically illustrating respective steps for fabricating the semiconductor device 100a.

Figure 18A:
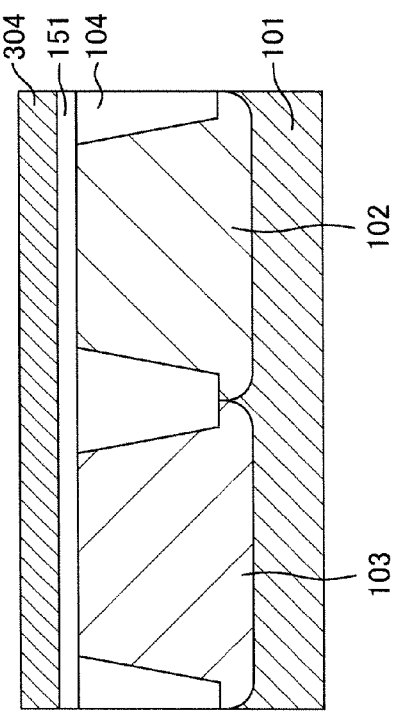
FIGS. 18A-18D cross-sectional views illustrating respective steps for fabricating a semiconductor device according to the third embodiment.

First, as shown in FIG. 18A, an isolation layer 104, an n-type well region 102, a p-type well region 103, and a high dielectric film 151 are formed on a substrate 101. This step is the same as the step shown in FIG. 9A in the first embodiment.

Figure 18B:
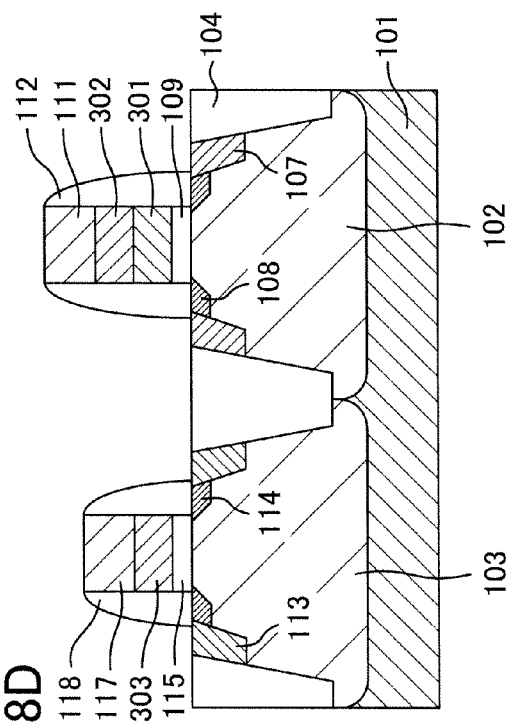

Next, as shown in FIG. 18B, a first TiN film 304 is formed on the high dielectric film 151 to have a thickness of 15 nm or more. In this step, the method described in the first and second embodiments is used to cause a halogen element to be eccentrically located at the interface between the high dielectric film 151 and the first TiN film 304.

Figure 18C:
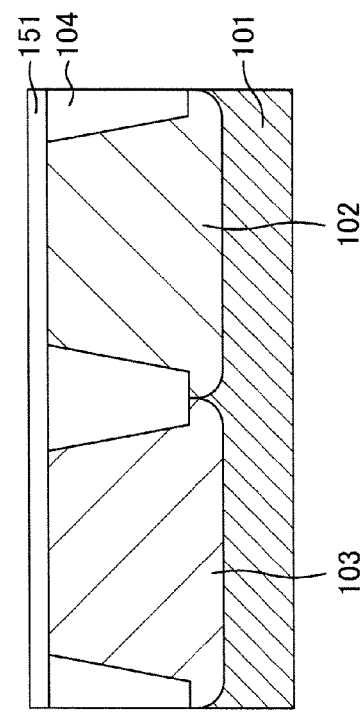

Subsequently, a step of FIG. 18C is performed. First, at the p-channel transistor 105 side, a protective film (not shown) such as a resist, a silicon oxide film, and a silicon nitride film, etc. is formed, and a portion of the first TiN film 304 located at the n-channel transistor 106 side is removed. To remove the portion of the n-channel transistor 106, for example, etching using a mixed liquid of sulfuric acid and a hydrogen peroxide solution is performed. Subsequently, after removing the protective film, a second TiN film 305 which does not contain a halogen element is formed to have a thickness of about 5 nm. To form the second TiN film 305, for example, reactive sputtering may be used.

Figure 18D:
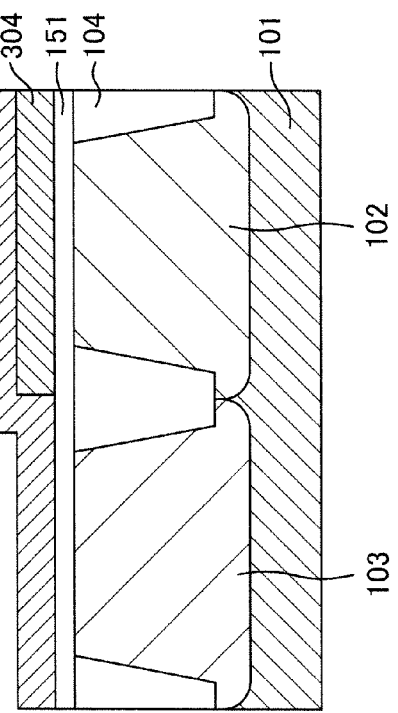

Thereafter, similar to the steps described in the first embodiment with reference to FIGS. 9B-9D, a structure of FIG. 18D is obtained. Note that in the p-channel transistor 105, the high dielectric film 151, the first TiN film 304, and the second TiN film 305 are formed into the gate insulating film 109, the lower layer TiN electrode 301, and the upper layer TiN electrode 302, respectively. Also, in the n-channel transistor 106, the high dielectric film 151 and the second TiN film 305 are formed into the gate insulating film 109 and the TiN electrode 303, respectively.

For the semiconductor device 100a described above, an efficient structure in which the work function of the lower layer TiN electrode 301 in the p-channel transistor 105 is increased while increase in work function of the TiN electrode 303 in the n-channel transistor 106 is prevented can be realized. In the semiconductor device 100a configured as described above, each of the p-channel transistor and the n-channel transistor has a work function around a silicon band edge, and thus, can be realized as a high speed transistor having a high-k gate insulating film/a metal gate electrode structure which can operate with a low threshold.

According to the present disclosure, a highly reliable semiconductor device which can operate with a low threshold and at high speed can be provided, and therefore, the semiconductor device and the method for fabricating a semiconductor device described above are useful for various electronic devices using semiconductor integrated circuits.

What is claimed is:

1. A semiconductor device, comprising:
a first high dielectric gate insulating film formed on a substrate; and
a first metal gate electrode formed on the high dielectric gate insulating film,
wherein the first metal gate electrode is made of TiN including a plurality of crystalline portions and an amorphous portion located at a crystal grain boundary between the plurality of crystalline portions,
a grain size of the TiN is smaller in a lower portion of the first metal gate electrode than in an upper portion of the first metal gate electrode, where the lower portion is close to the first high dielectric gate insulating film, and the upper portion is farther away from the first high dielectric gate insulating film than the lower portion is,
the TiN includes a halogen element,
a first concentration of the halogen element of the TiN is higher in the lower portion than in the upper portion, and
the halogen element is localized in the amorphous portion.

2. The semiconductor device of claim 1, wherein the halogen element is at least one of chlorine or fluorine.

3. The semiconductor device of claim 1, wherein the first concentration of the halogen element in the lower portion is 1 ×10$^{19}$ atoms/cm$^3$ or more.

4. The semiconductor device of claim 1, wherein the thickness of the lower portion is 5nm or less.

5. The semiconductor device of claim 1, wherein the first high dielectric gate insulating film is made of a hafnium silicate film or a hafnium oxide film.

6. The semiconductor device of claim 5, wherein the first high dielectric gate insulating film contains at least one of La, Mg, Al, or Ta.

7. The semiconductor device of claim 1, wherein a p-channel transistor including the first high dielectric gate insulating film and the first metal gate electrode is formed.

8. The semiconductor device of claim 7, further comprising:
an n-channel transistor includes a second high dielectric gate insulating film and a second metal gate electrode, wherein
the first concentration of the halogen element in the lower portion is 1×10$^{19}$ atoms/cm$^3$ or more, and
a second concentration of the halogen element is 1 ×10$^{18}$ atoms/cm$^3$ or less at a second metal gate electrode side of an interface between the second high dielectric gate insulating film and the second metal gate electrode in the n-channel transistor.

* * * * *